(12) United States Patent
Karniewicz

(10) Patent No.: US 6,922,659 B2
(45) Date of Patent: Jul. 26, 2005

(54) PARAMETER POPULATION OF CELLS OF A HIERARCHICAL SEMICONDUCTOR STRUCTURE VIA FILE RELATION

(75) Inventor: Joseph J. Karniewicz, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/031,326

(22) Filed: Feb. 26, 1998

(65) Prior Publication Data

US 2001/0044927 A1 Nov. 22, 2001

(51) Int. Cl.$^7$ .............................................. G06F 17/50
(52) U.S. Cl. ................ 703/1; 703/2; 716/8; 716/11; 716/12
(58) Field of Search ................... 703/1, 2, 14, 23, 703/26, 27; 716/8, 11, 12, 17, 5, 4, 7; 326/39; 395/500.18, 500.04, 500.05; 707/102, 104, 503, 505; 365/201

(56) References Cited

U.S. PATENT DOCUMENTS

| | | | | |
|---|---|---|---|---|
| 5,455,938 A | * | 10/1995 | Ahmed | 364/488 |
| 5,519,627 A | * | 5/1996 | Mahmood et al. | 364/488 |
| 5,524,244 A | * | 6/1996 | Robinson et al. | 395/700 |
| 5,675,545 A | * | 10/1997 | Madhavan et al. | 365/201 |
| 5,726,902 A | | 3/1998 | Mahmood et al. | 364/489 |
| 5,754,760 A | * | 5/1998 | Warfield | 395/183.14 |
| 5,761,498 A | * | 6/1998 | Ooe et al. | 395/610 |
| 5,774,358 A | * | 6/1998 | Shrote | 364/191 |
| 5,890,155 A | * | 3/1999 | Steinman et al. | 707/9 |
| 5,893,910 A | * | 4/1999 | Martineau et al. | 707/10 |
| 5,911,139 A | * | 6/1999 | Jain et al. | 707/3 |
| 5,983,277 A | * | 11/1999 | Heile et al. | 709/232 |
| 6,009,251 A | * | 12/1999 | Ho et al. | 395/500.06 |
| 6,011,911 A | * | 1/2000 | Ho et al. | 395/500.06 |
| 6,026,223 A | | 2/2000 | Scepanovic et al. | 395/500.11 |
| 6,026,226 A | | 2/2000 | Heile et al. | 395/500.13 |
| 6,035,297 A | * | 3/2000 | Van Huben et al. | 707/8 |
| 6,175,949 B1 | * | 1/2001 | Gristede et al. | 716/11 |
| 6,249,902 B1 | * | 6/2001 | Igusa et al. | 716/10 |
| 6,421,814 B1 | * | 7/2002 | Ho | 716/5 |
| 6,425,113 B1 | * | 7/2002 | Anderson et al. | 716/5 |
| 6,449,757 B1 | * | 9/2002 | Karniewicz | 716/7 |

* cited by examiner

Primary Examiner—Thai Phan
(74) Attorney, Agent, or Firm—Schwegman, Lundberg, Woessner & Kluth, P.A.

(57) ABSTRACT

Parameter population of cells for a hierarchical semiconductor structure via file relation is disclosed. One aspect of the invention is a computerized system that includes a global file of global variables, a plurality of local files, and a plurality of cells. Each local file relates a plurality of local variables to the global variables. Each cell corresponds to a local file and has a set of parameters corresponding to the local variables of the local file.

36 Claims, 4 Drawing Sheets

PARAMETER POPULATION OF CELLS OF A HIERARCHICAL SEMICONDUCTOR STRUCTURE VIA FILE RELATION

RELATED FILES

The present application is related to the co-filed, and co-assigned application entitled "Hierarchical Semiconductor Structure Design," U.S. Ser. No. 09/031,398, filed Feb. 26, 1998, now U.S. Pat. No. 6,449,757, which is hereby incorporated by reference.

FIELD OF THE INVENTION

This invention relates generally to the cells of a hierarchical semiconductor structure, and more particularly to populating parameters of such cells by relating files.

BACKGROUND OF THE INVENTION

Semiconductor technology pervades most electronic devices today. Computers, televisions, videocassette recorders, cameras, etc., all use semiconductor integrated circuits to varying degrees. For example, the typical computer includes microprocessors and dedicated controller integrated circuits (i.e., video controllers, audio controllers, etc.), as well as memory, such as dynamic random-access memory. The design of semiconductors, therefore, is a crucial consideration of the design of almost any electronic device.

One type of semiconductor design is the design of semiconductor test structures. A semiconductor integrated circuit, for example, must be able to operate in a variety of different conditions (varying temperatures, for example), and perform within a variety of different specifications (i.e., speed, power consumption, etc.). Semiconductor test structures are therefore utilized to ensure that various components of a given semiconductor will perform according to specification in different conditions. Test structures are not integrated circuits sold to end consumers as part of an electronic device, but rather are used internally to ascertain that the end products will perform correctly.

To aid in the design of semiconductors in general, and the design of semiconductor test structures in particular, software such as Design Framework II (DF2), available from Cadence Design Systems, Inc., has been developed. DF2, for example, includes an editor that permits a designer to place various components over a semiconductor substrate as necessary. DF2 also provides for a degree of flexibility in the design of such components. Specifically, DF2 includes parameterized cells, or pcells, that allow the designer to create customized instances of a pcell every time the pcell is placed on a layer. For example, a transistor can be created and have parameters assigned thereto to provide for control of its width, length, and number of gates. When instances of the transistor are placed on the layer, different values may be assigned to each of these parameters. According to the parameter values, each instance varies in size and composition.

The pcell approach of DF2, however, is a top-down semiconductor design approach, and thus has limitations and disadvantages associated with it. A designer may, for example, first draw a transistor, and then program that transistor to respond to parameters that will cause various parts of the design to take on those parameter values. This can be a very complex, tedious and error-prone process. For example, if the designer desires contacts to fill in the available active area space while maintaining a certain pitch and minimum separation from the active area edge, the equations to accomplish this for an arbitrarily sized active area are complex within DF2. Furthermore, these equations are specific to the transistor under development. If the designer desires to design another parameterized object—for example, a field transistor or a contact chain—he or she needs to repeat the entire process.

A solution to the limited flexibility of pcells within DF2 is described in the co-pending, co-filed and co-assigned patent application entitled "Hierarchical Semiconductor Structure Design." In this application, a hierarchy of abstractions of a semiconductor structure is described. At the lowest level are basic atom cells, which are combinable into higher-level cells, which are combinable into devices, which are finally combinable into a test structure. In this manner, changing the parameters of a structure automatically changes the parameters of the constituent devices, higher-level cells, and basic atom cells. That is, changing the parameters of a structure does not require redesign of the structure. Thus, this application describes a hierarchical design approach that affords designers much greater flexibility and efficiency.

However, where semiconductor structure designers instill their rules for test structures in a separate document or file, they still must translate these rules by hand into parameters for the structures (and potentially in other cells that may be used in a hierarchical semiconductor structure design). This renders the hierarchical semiconductor structure design approach potentially vulnerable to mistakes in keying in the parameters, and also adds a potentially time-consuming and labor-intensive step in changing the parameters of a structure based on new design rules. Furthermore, if the semiconductor designer wishes to ensure that all contacts in the many instances of cells that he or she may have placed all have exactly the same contact size, for example, the designer will have to visit each cell and check that the values are the same in each. There is no facility for creating a global input parameter that ensures a universal value for a specific parameter in each cell instance.

There is a need, therefore, for a more efficient and less error-prone manner by which design rules are translated into parameters for structures and other cells, and the parameters keyed into these structures and other cells. Such a manner should allow for the inputting of global parameters to ensure that universal values for a specific parameter in each of a plurality of cell instances are entered, as well.

SUMMARY OF THE INVENTION

The above-mentioned shortcomings, disadvantages and problems are addressed by the present invention, which will be understood by reading and studying the following specification. One aspect of the invention is a computerized system that includes a global file of global variables, a plurality of local files, and a plurality of cells. Each local file relates a plurality of local variables to the global variables. Each cell corresponds to a local file and has a set of parameters corresponding to the local variables of the local file.

In this manner, the invention provides for more-efficient and more-accurate population of parameters of cells used in hierarchical semiconductor structure design. A global file of global variables desirably includes values for all the global variables and are not specific to any given structure (i.e., any type of cell). Each structure or cell has a corresponding local file, that relates local variables corresponding to parameters for the structure or cell to these global variables.

Thus, when the global file is changed, an update mechanism, such as a computer program, may be run to update the set of parameters for each cell by reading values for the global variables to which the local variables of the corresponding local file correspond. Manual keying of parameters into cells is unnecessary. This means that population of these parameters into these cells in performed much more quickly, with less chance for errors occurring that may occur in the manual entry of such parameters.

The invention may be used in at least two different ways, according to one embodiment of the invention. For a user of an existing structure or design, the local files may be instance files, such that they relate to particular instances of cells or structures. Thus, changes made to global design rules as captured in the global variables of the global file may be related to individual instances of cells by their corresponding local (instance) files. Furthermore, for a designer desiring to change an existing structure or design, or create a new structure or design, the local files may be inherit files. Inherit files allow the designer to input all of the complex equations for any cell (basic atom cell, higher-order cell, etc.) into the cell, such that when the cell is compiled, the desired resulting cell is created. (For example, a standard C5_235 cell may be turned into a transistor cell.)

Furthermore, in one particular embodiment of the invention, the system also includes a cleansheet file, which desirably is a spreadsheet that contains current design rules for the plurality of cells, such that values for the global variables of the global file are derived therefrom. In this embodiment, desirably an extract mechanism, such as a computer program, is utilized to update values for the global variables of the global file from the current design rules of the clean sheet file. If a design is performed with well construct global and local files, then the design can parametrically adjust itself to any new set of design rules without a designer having to manually redraw a single structure.

The present invention includes computerized systems, methods, structures, computer-readable media, and computers of varying scope. In one embodiment of the invention, the invention is implemented in conjunction with Design Framework II (DF2) software available from Cadence Design Systems, Inc. In addition to the aspects and advantages of the present invention described in this summary, further aspects and advantages of the invention will become apparent by reference to the drawings and by reading the detailed description that follows.

DETAILED DESCRIPTION OF THE INVENTION

In the following detailed description of exemplary embodiments of the invention, reference is made to the accompanying drawings which form a part hereof, and in which is shown by way of illustration specific exemplary embodiments in which the invention may be practiced. These embodiments are described in sufficient detail to enable those skilled in the art to practice the invention, and it is to be understood that other embodiments may be utilized and that logical, mechanical, electrical and other changes may be made without departing from the spirit or scope of the present invention. The following detailed description is, therefore, not to be taken in a limiting sense, and the scope of the present invention is defined only by the appended claims.

Those of ordinary skill within the art will appreciate that the detailed description is presented in accordance with the example of designing a semiconductor test structure. However, the invention itself is not limited to the design of semiconductor test structures. Rather, the invention may be utilized in the design of any semiconductor structure, in a manner identical to that described with respect to semiconductor test structures. The example of the semiconductor test structure is only presented in the detailed description specifically as an exemplary structure, to provide for clear description of the invention.

The detailed description is divided into three sections. In the first section, a representative hierarchical semiconductor test structure, computer, and semiconductor may in conjunction with which embodiments of the invention may be utilized or applied are described. In the second section, an exemplary embodiment of the invention is presented; this embodiment of the invention may be practiced in conjunction with Design Framework II (DF2) software available from Cadence Design Systems, Inc., although the invention is not so limited. Finally, in the third section, a conclusion of the detailed description is provided.

Representative Hierarchical Test Structure, Computer and Semiconductor Memory

Figure 1A:
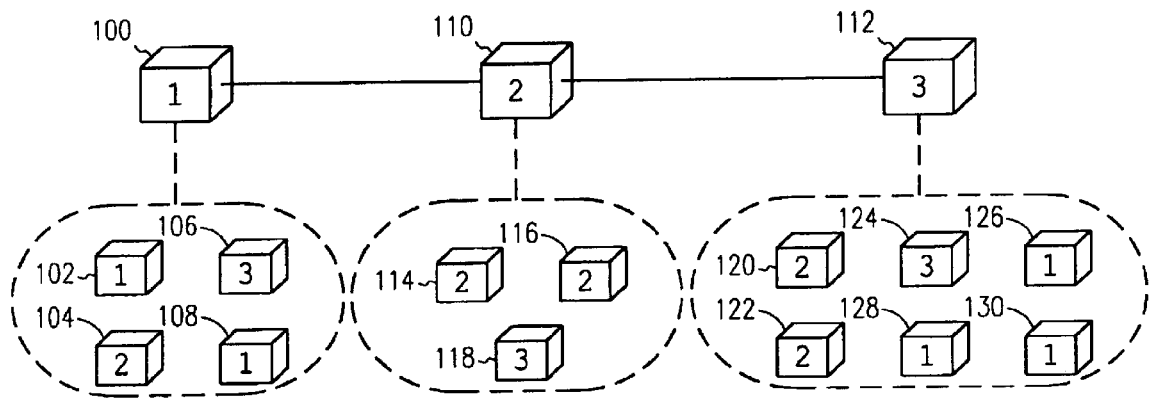
FIGS. 1(a), 1(b), and 1(c) show diagrams of a representative hierarchy of a semiconductor structure, in accordance with which embodiments of the invention may be implemented.
Figure 1B:
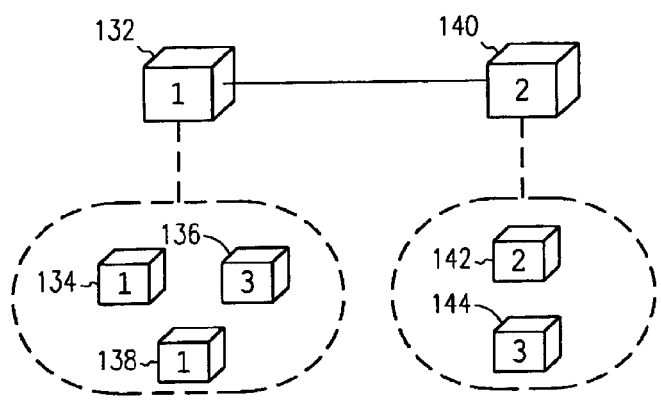
Figure 1C:
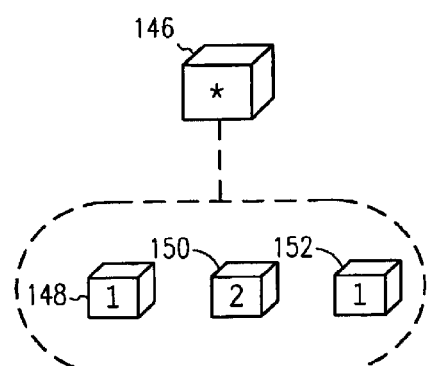
Figure 2:
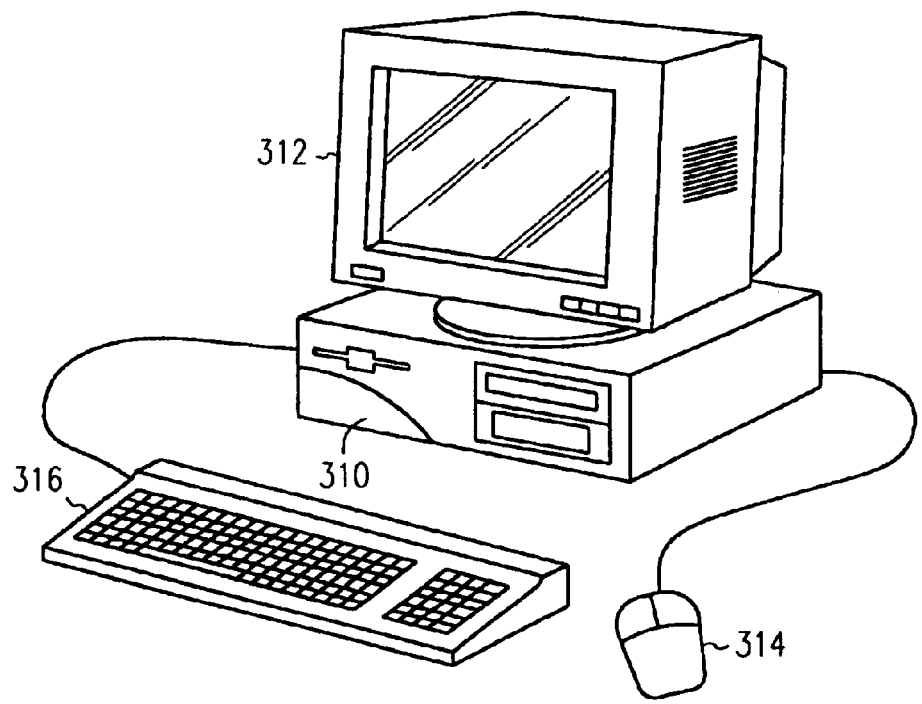
FIG. 2 shows a diagram of a computer in conjunction with which an embodiments of the invention may be implemented.
Figure 3:
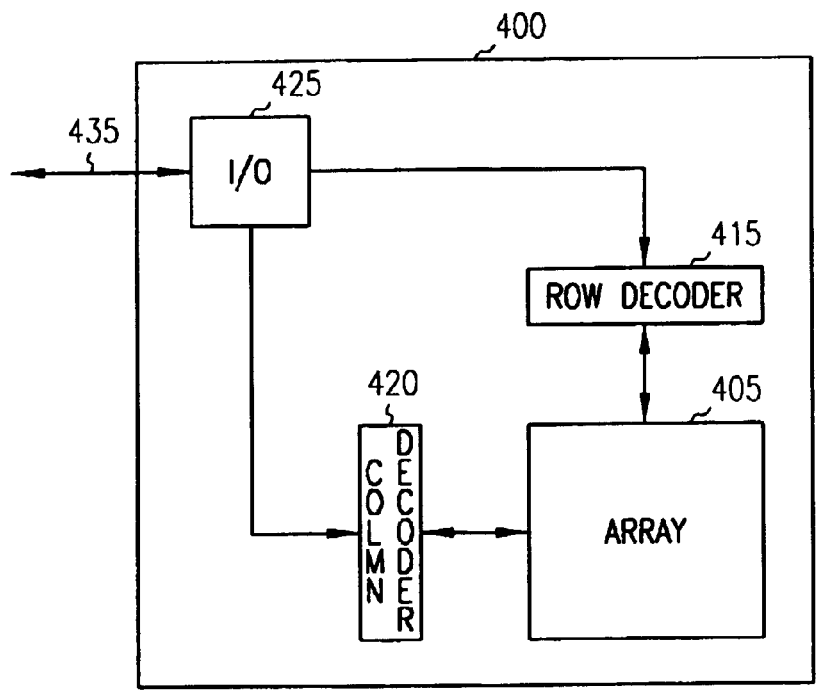
FIG. 3 shows a diagram of a semiconductor memory that may be tested with a semiconductor test structure hierarchically designed in conjunction with which embodiments of the invention may be utilized (although the invention is not so limited)

A description of a representative hierarchical semiconductor test structure, computer, and semiconductor may in conjunction with which embodiments of the invention are provided in this section of the detailed description. The description is provided in conjunction with reference to FIGS. 1(a), 1(b), 1(c), 2, and 3. FIGS. 1(a)–1(c) show diagrams of a representative hierarchy of a semiconductor test structure in conjunction with which embodiments of the invention may be practiced. FIG. 2 shows a diagram of a computer in conjunction with which embodiments of the invention may be implemented. Finally, FIG. 3 shows a diagram of a semiconductor memory that may be tested with a semiconductor test structure hierarchically designed, and utilizing an embodiment of the invention (although the invention is not limited to use in conjunction with a semiconductor memory).

FIGS. 1(a), 1(b) and 1(c) show diagrams of a representative hierarchy of a semiconductor test structure in conjunction with which embodiments of the invention may be practiced. The invention is not limited to application of such a hierarchy. For example, the invention may be utilized in conjunction with the specific embodiments of a hierarchical semiconductor test structure shown and described in the co-filed, co-pending, and co-assigned patent application entitled "Hierarchical Semiconductor Test Structure Design."

Referring first to FIG. 1(a), a diagram of three higher-order cells, each defined by relating a number of instances of basic atom cells, is shown. Higher-order cell 100, defining type "1" higher-order cells, is defined by relating four instances of basic atom cells, atoms 102, 104, 106 and 108. Atoms 102 and 108 are instances of basic atom cells of type "1"; atom 104 is an instance of basic atom cell of type "2"; and, atom 106 is an instance of basic atom cell of type "3". The type defined by higher order cell 100 (i.e., "1"), and the types of atoms 102, 104, 106 and 108 (i.e., "1", "2", and "3"), are for representative purposes only, and do not specifically relate to any given type of semiconductor component. Thus, the types as used in FIG. 1(a) (and as will be used in FIG. 1(b) and FIG. 1(c) as well) are for notational and descriptive purposes only.

Furthermore, each of higher order cell 100, and atoms 102, 104, 106 and 108 have a set of parameters related to its type. For example, the parameters may be related to placement, size, etc. (i.e., different attributes of the given cell). Desirably, higher order cell 100 has parameters that when changed also change the parameters of atoms 102, 104, 106 and 108 as necessary. Thus, higher order cell 100 relates atoms 102, 104, 106 and 108 to one another. Making an instance of cell 100 larger, for example, causes corresponding changes in atoms 102, 104, 106 and 108 that make up that instance of cell 100.

Still referring to FIG. 1(a), two other higher-order cells are defined, cells 110 and 112. Cell 110 is made up of atoms 114, 116 and 118. Atoms 114 and 116 are of type "2", and atom 118 is of type "3"; cell 110 itself defines type "2" for higher-order cells. Similarly, cell 112 is made up of atoms 120, 122, 124, 126 and 128, where atoms 120 and 122 are of type "2", atom 124 is of type "3", and atoms 126, 128 and 130 are of type "3". Cell 112 itself defines type "3" for high-order cells. As with cell 100 and its constituent atoms, cells 110 and 112 and their constituent atoms each has a set of parameters related to its type. Desirably, when a parameter of either cell 110 or 112 changes, one or more parameters of one or more of the associated constituent atoms also change.

The basic hierarchical structure shown in FIG. 1(a) is a powerful tool for the design of semiconductor test structures. For example, once higher-order cells 100, 110 and 112 have been defined as is shown in FIG. 1(a), they may be utilized to create more complex devices and structures, without forcing the designer to concern him or herself over details regarding the individual constituent atoms of the higher-order cells. For example, the designer may wish to design a transistor. Atoms 102 and 104 may be the two basic atoms necessary in such a design; each exists independently and has significant programming therein. Cell 100, then, may be a higher-level structure, where parameters from atoms 102 and 104 are inherited up to cell 100. A cell called tran, for transistor, is then created by placing an instance of cell 100 and setting the parameters of cell 100 such a transistor is formed—the cell tran can then be used by anyone by setting its parameters. Transistors of different sizes and shapes can be created.

An additional level of the hierarchical structure initially described in FIG. 1(a) is shown in FIG. 1(b), which is a diagram of two devices, each defined by relating a number of instances of the higher-order cells that have been defined in FIG. 1(a). Device 132, defining type "1" devices, is defined by relating three instances of higher-order cells, cells 134, 136 and 138. Cells 134 and 138 are instances of cells of type "1,"as has been defined as cell 100 of FIG. 1(a); cell 136 is an instance of cells of type "3," as has been defined as cell 112 of FIG. 1(a). As with FIG. 1(a), the type defined by device 132 is for representative purposes only, and does not specifically relate to any given type of semiconductor component.

Each of device 132 and cells 134, 136 and 138 has a set of parameters related to its type. Desirably, device 132 has parameters that when changed also change the parameters of cells 134, 136 and 138, which in turn change the parameters of the atoms making up these cells (not shown in FIG. 1(b)). That is, changing a parameter for device 132 may change a parameter for cell 136, which as a type "3" higher-order cell has six constituent atoms, as has been shown in and described in conjunction with FIG. 1(a). Thus, the changing of the parameter for cell 136 instigated by changing a parameter for device 132 also may change one or more parameters of one or more of these six constituent atoms.

Still referring to FIG. 1(b), one other device is defined, device 140. Device 140 is made up of two instances of higher-order cells, cells 142 and 144. Cell 142 is of type "2," as has been defined as cell 110 of FIG. 1(a), and cell 144 is of type "3,"as has been defined as cell 112 of FIG. 1(a). Device 140 itself defines type "2" for devices. As with device 132 and its constituent higher-order cells, device 140 and its constituent higher-order cells each has a set of parameters related to its type. Desirably, when a parameter of device 140 changes, one or more parameters of one or more of its constituent cells changes as well, propagating a change of one or more parameters of one or more of the atoms making up these constituent cells.

Therefore, the basic hierarchical structure shown in FIG. 1(a) is expanded by the structure shown in FIG. 1(b). In FIG. 1(b), two devices are defined. A designer of a semiconductor test structure may therefore utilize these devices within the test structure, such that the designer does not need to concern him or herself with the actual higher-order cells making up these devices, or the constituent atoms making up the higher-order cells. The devices may thus be viewed as a higher abstraction than the higher-order cells, just as the higher-order cells are a higher abstraction than the basic atom cells.

The hierarchical structure shown in FIG. 1(a) and extended in FIG. 1(b) may be additionally extended as shown in FIG. 1(c), which is a diagram of a semiconductor test structure, defined by relating three instances of the devices that have been defined in FIG. 1(b). Semiconductor test structure 146 is defined by relating two instances of devices of type "1," devices 148 and 152, as devices of type "1" have been defined as device 132 of FIG. 1(b), and one instance of devices of type "2," device 150, as devices of type "2" have been defined as device 140 of FIG. 1(b). The semiconductor test structure of FIG. 1(c) is for representative purposes only, and does not specifically relate to any given type of semiconductor structure.

Each of structure 146 and devices 148, 150 and 152 has a set of parameters related to its type. Desirably, structure 146 has parameters that when changed also change the parameters of devices 148, 150 and 152, which in turn change the parameters of the higher-order cells making up these devices (not shown in FIG. 1(c)), which in turn change the parameters of the atoms making up these cells (also not shown in FIG. 1(c)). That is, changing a parameter for structure 146 may change a parameter for device 150, which as a type "2" device has two constituent higher-order cells, as has been shown in and described in conjunction with FIG. 1(b). Further, this change in a parameter for device 150 may cause a change in one of the parameters of one of the two constituent higher-order cells, which may then cause a change in one of the parameters of one of the basic atom cells of this higher-order cell.

Thus, the semiconductor test structure of FIG. 1(c) (as based on the structures of FIGS. 1(a) and 1(b)) may be viewed as being represented by a hierarchical data structure having four layers of abstraction: a highest layer of abstraction, the test structure itself; a second highest layer of abstraction, the devices making up the test structure; a third highest layer of abstraction, the higher-order cells making up the devices; and a lowest level of abstraction, the basic atom cells making up the higher-order cells. Changing the parameters of any one layer of abstraction causes the changing of the parameters of an immediately lower layer of abstraction, which then propagates changes down to the lowest level of abstraction. The FIGS. 1(a), 1(b) and 1(c) may also be viewed as a computerized system, such that changing one aspect (parameter) of the system during the design of a test structure causes lower aspects of the system to automatically change.

Referring next to FIG. 2, a diagram of a computer in conjunction with which an exemplary embodiment of the invention may be implemented is shown. Those of ordinary skill within the art will recognize that the invention is not limited to the computer shown in FIG. 2, however. In one embodiment, the computer is running Design Framework II (DF2) software, available from Cadence Design Systems, Inc., and in conjunction with which an embodiment of the invention may be implemented.

Computer 310 of FIG. 2 is operatively coupled to monitor 312, pointing device 314, and keyboard 316. Computer 310 includes a processor (such as an Intel Pentium processor or a reduced instruction set (RISC) processor), random-access memory (RAM), read-only memory (ROM), and one or more storage devices, such as a hard disk drive, a floppy disk drive (into which a floppy disk can be inserted), an optical disk drive, and a tape cartridge drive. The memory, hard drives, floppy disks, etc., are types of computer-readable media. The invention is not particularly limited to any type of computer 310. Computer 310 desirably is a computer running a version of the UNIX operating system. The construction and operation of such computers are well known within the art.

Furthermore, computer 310 may be communicatively connected to a local-area network (LAN), a wide-area network (WAN), an Intranet, or the Internet, any particular manner by which the invention is not limited to, and which is not shown in FIG. 2. Such connectivity is well known within the art. In one embodiment, the computer includes a modem and corresponding communication drivers to connect to the Internet via what is known in the art as a "dial-up connection." In another embodiment, the computer includes an Ethernet or similar hardware card to connect to a local-area network (LAN) or wide-area network (WAN) that itself is connected to an Intranet or the Internet via what is know in the art as a "direct connection" (e.g., T1 line, etc.).

Monitor 312 permits the display of information, including computer, video and other information, for viewing by a user of the computer. The invention is not limited to any particular monitor 312, and monitor 312 is one type of display device that may be used by the invention. Such monitors include cathode ray tube (CRT) displays, as well as flat panel displays such as liquid crystal displays (LCD's). Pointing device 314 permits the control of the screen pointer provided by the graphical user interface of operating systems. The invention is not limited to any particular pointing device 314. Such pointing devices include mouses, touch pads, trackballs, remote controls and point sticks. Finally, keyboard 316 permits entry of textual information into computer 310, as known within the art, and the invention is not limited to any particular type of keyboard.

Referring finally to FIG. 3, a diagram of a semiconductor memory that may be tested with a semiconductor test structure hierarchically designed and utilizing an embodiment of the invention is shown. That is, FIG. 3 shows a semiconductor memory for which semiconductor test structures designed in accordance with a hierarchical manner may be utilized—the reason why semiconductor test structures are necessary is to ensure that semiconductor circuits such as the memory of FIG. 3 correctly perform according to specification. However, as described in the beginning of this detailed description, the invention itself is not limited to the design of a semiconductor test structure; the invention may be used in conjunction with the design of any semiconductor structure. The design of a semiconductor test structure is merely an exemplary use, and is used specifically in the detailed description only as such.

FIG. 3 is specifically a schematic/block diagram illustrating generally an architecture of one embodiment of a memory 400 in conjunction with which the present invention may be utilized. In the embodiment of FIG. 3, memory 400 is a dynamic random access memory (DRAM). However, the invention can be applied to other semiconductor memory devices, such as static random access memories (SRAMs), synchronous random access memories or other types of memories that include a matrix of selectively addressable memory cells.

Memory 400 includes a memory cell array 405, having memory cells therein that include floating gate transistors. X gate decoder 415 provides a plurality of gate control lines for addressing floating gate transistors in array 405. Y source/drain decoder 420 provides a plurality of source/drain interconnection lines for accessing source/drain regions of the floating gate transistors in array 405. Input/output circuitry 425 includes necessary sense amplifiers and input/output (I/O) circuitry for reading, writing, and erasing data to and from array 105. In response to address signals that are provided on address lines 435 during read, write, and erase operations, the operation of decoders 415 and 420 are controlled. The address signals are provided by a controller such as a microprocessor that is fabricated separately or together with memory 400, or otherwise provided by any other suitable circuits.

The description of a representative hierarchical data structure, computer, and semiconductor memory in conjunction with which embodiments of the invention may be implemented or applied has been provided. Specifically, in conjunction with FIGS. 1(a)–1(c), a description of a hierarchical manner by which semiconductor test structures may be designed has been presented. In conjunction with FIG. 2, a description of a computer in which embodiments of the invention has been presented. Finally, in conjunction with FIG. 3, a description of a semiconductor memory that may be the motivation for a hierarchical design of semiconductor test structures that may utilize an embodiment of the invention has also been provided.

EXEMPLARY EMBODIMENT OF THE INVENTION

In this section of the detailed description, a description of an exemplary embodiment of the invention is presented. As used in this part of the detailed description, the term "cell" refers to any level of abstraction within a hierarchical semiconductor test structure. For example, the term cell may refer to a basic atom cell, a higher-order cell, a device, or a structure, as these latter elements have been described in the previous section of the detailed description. Thus, updating parameters of a cell by file relation in the scope of the invention means updating the parameters of a basic atom cell, a higher-order cell, a device, a structure, or any level of abstraction within a hierarchical semiconductor test structure.

Figure 4:
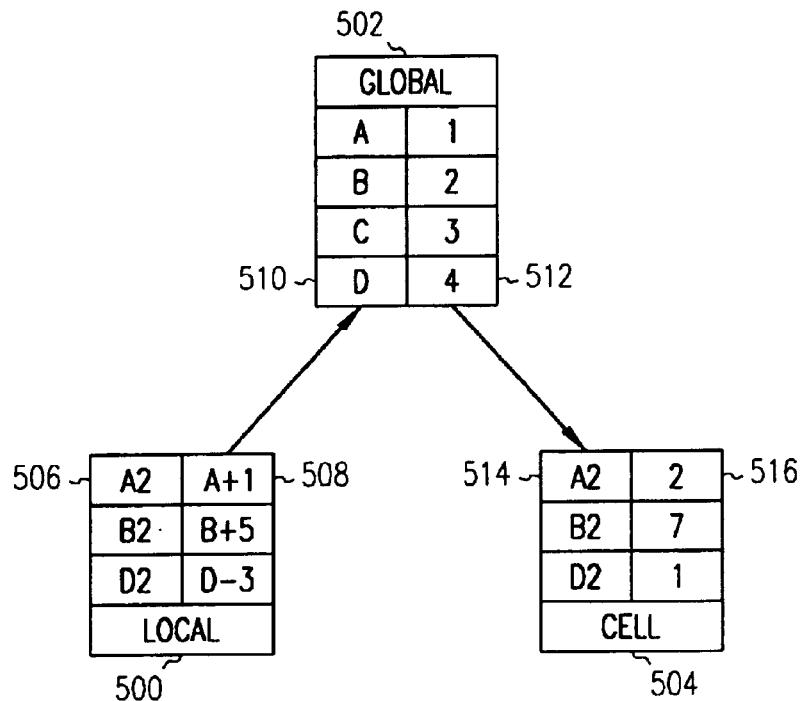
FIG. 4 shows a diagram illustrating the manner by which parameters of a cell are updated by relating a corresponding local file to a global file, according to one embodiment of the invention.

Referring first to FIG. 4, a diagram illustrating the manner by which parameters of a cell are updated by relating a corresponding local file to a global file, according to one embodiment of the invention, is shown. Local file 500 is related to global file 502 to update parameters within cell 504. Note there may be more than one local file 500 and more than one cell 504; only one local file and only one cell are shown for purposes of illustrative clarity. More specifically, local variables of local file 500 that correspond to parameters within cell 504 are desirably (but not necessarily) related to corresponding global variables within global file 502 to update these parameters. Thus, changing design rules dictates only a change in the global variables within global file 502; parameters within cell 504 are automatically changed by relating file global 502 to local file 500.

Local file 506 includes a table of two columns: a local variable column 506, and a global variable relation column 508. This table thus defines how local variables within column 506 relate to global variables, by the relation shown within column 508. For example, as shown in FIG. 4, local variable A2 is equated to global variable A, plus one; local variable B2 is equated to global variable B, plus five; and, local variable D2 is equated to global variable D, minus three.

Global file 502 also includes a table of two columns: a global variable column 510, and a variable value column 512. This table thus defines the values for each of the global variables within column 510, by equating these variables to values present in column 512. For example, as shown in FIG. 4, global variable A is equated to one, global variable B is equated to two, global variable C is equated to three, and global variable D is equated to four.

Cell 504 also includes a table of two columns: a parameter column 514, and a parameter value column 516. This table thus defines the values for each of the parameters within column 514, as stored in column 516. The values themselves are derived by relating corresponding local variables within column 506 of local file 500 to the appropriate global variables within column 510 global file 502. This means that the relation for these local variables shown in column 508 of local file 500 is evaluated, substituting the values of column 512 of global file 512 for the global variables within the relation of column 508 of local file 500.

For example, parameter A2 of cell 504 corresponds to local variable A2 of local file 500, because local file 500 is the corresponding local file for cell 504. Local variable A2 is defined by the relation: global variable A+1. Global variable A within global file 502 is equated with a value of one. Therefore, parameter A2 is equal to one plus one, or two, as is shown in FIG. 4. For further example, parameter B2 of cell 504 corresponds to local variable B2 of local file 500. Local variable B2 is defined by the relation: global variable B+5. Global variable B within global file 502 is equated with a value of two. Therefore, parameter B2 is equal to five plus two, or seven, as is shown in FIG. 4.

As those of ordinary skill in the art can appreciate, the manner by which parameters of cells are populated after design rule changes, as shown in FIG. 4, according to one embodiment of the invention, is more efficient and error resistant than prior art manners. For example, where there are thousands of cells 504, with corresponding thousands of local files 500, changes are required to only a single global file 502 to update the parameters of these cells. Because the parameters of the cells correspond to local variables within local files which define relations of global variables, relating local files with the global file provides for efficient and error-resistant population of the parameters of the cells.

Furthermore, those of ordinary skill within the art can appreciate that the invention is not limited to any particular relation of local variables to global variables. For example, as shown in FIG. 4, local variables such as A2 are defined by a mathematical formula involving a single global variable, such as A plus one. However, the invention is not so limited. Local variables may be defined by formulas involving many global variables (e.g., A+B−7), for instance, or by any other manner.

The embodiment of the invention shown in FIG. 4 may be used in the context of instance files, for cell users, as well as inherit files, for cell designers, among other contexts. For example, with respect to cell users, the invention provides three levels of flexibility. A local file acting as an instance file may have the manner by which local variables relate to global variables changed (such as local variable A2 equating to global variable A+5 changed to local variable A2 equating to global variable A+7−global variable B), which is a first level of flexibility. A second level of flexibility is provided by changing the value to which a given global variable is set within the global file (such as changing A=7 in the global file to A=9). A third level of flexibility is offered in that different instances of a cell can have different local (instance) files associated therewith. For example, for four instances of transistor cells, each can have the same instance file associated therewith, such that all four instances have the same size, etc., or each can have different instance files associated therewith, such that all four instances are different, etc.

With respect to cell designers, the invention also acts to reduce the potential for error in the input of large equations necessary to define cells (for example, in software products such as DF2). That is, during the process of creating a cell, very complex equations have to be manually entered into entry windows that are frequently quite small. Manually typing in these equations or cutting and pasting them in is very prone to error. Therefore, the designer is able to use an embodiment of the invention, where the local file acts as an inherit file, to input (or, inherit) all of the complex equations from a file into the definition of a cell. Once the equations have been entered by this process, the cell can then be compiled, such that, for example, a C5_235 cell is turned into a transistor cell. Note that inherit files also have the ability to read the global file if global variables are referred to therein, since they are in fact local files.

Thus, global variables can be buried deep into a cell during compilation and never been seen by a cell user, although the variables are reflected in the cell. Or, the global variables can be explicitly put into an instance file by associating a local variable with a global value. In one embodiment of the invention, both manners by which local files can be utilized are used, to provide for maximum flexibility in the use and design of hierarchical semiconductor structures.

An example provides further clarity in distinguishing instance and inherit files. Instance files are used by cell users who are placing cells in a layout drawing and setting parameter values. The files have an associated mechanism to automatically load parameters through associated files and also to make use of a global variables feature. For example, the variables and values for a transistor placement may be GateLength=5.0; Gate_To_Cont_Space=2.0; Cont_To_Active_Space=G_CtoGSpace; and, Cont_Size=G_Cont_Size+2.0. The variables having the prefix G_ are global variables and are only available through file association.

Conversely, inherit files are used by cell creators. For example, a designer would open a file called tran, for transistor, and place an appropriate higher-order cell therein (such as C5_234). This higher-order cell may have a parameter such as L1X. This parameter may be set to the following, for example:

L1X=GateLength+2.0*Gate_To_Cont_Space+ 2.0*Cont_To_Active_Space+2.0*Cont_Size. The cell would then be compiled. Inherit files allow for such complex equations to be entered by relating the cell to an inherit (local) file that includes this equation. Like local files that are instance files, inherit files also relate to a global file to receive values for any global variables present within the equation.

Figure 5:
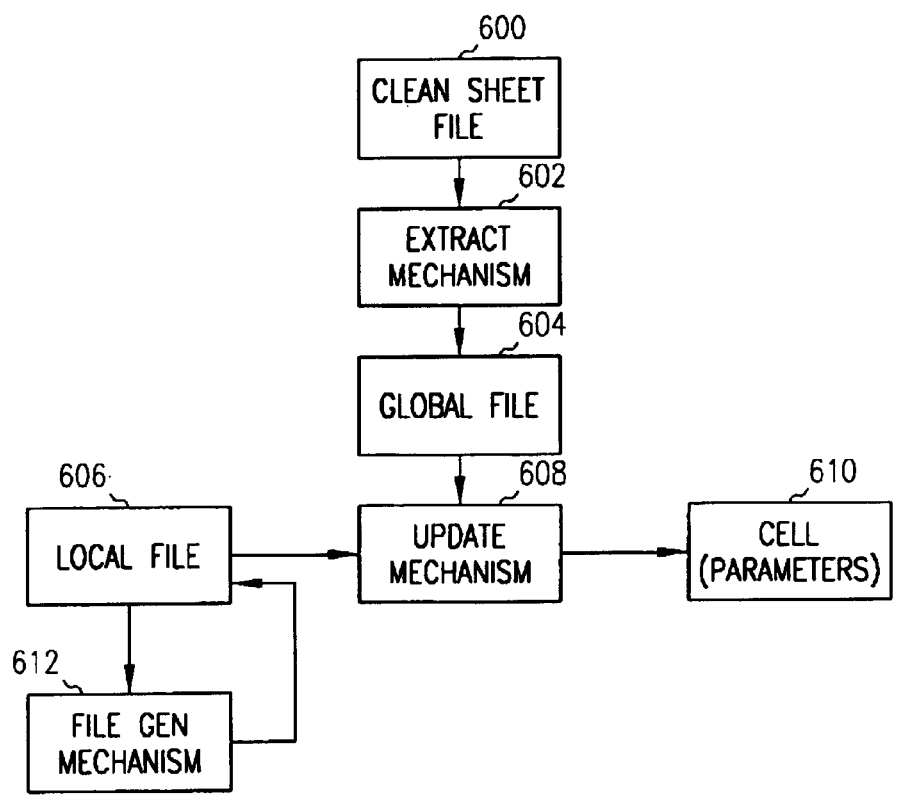
FIG. 5 shows a diagram of a computerized system according to one embodiment of the invention; and, FIG. 6 shows a flowchart of a method according to one embodiment of the invention.

Referring next to FIG. 5, a diagram of a computerized system according to one embodiment of the invention is shown. Cleansheet file 600 is desirably a file stored on a computer-readable medium, such as a floppy disk, random-access memory (RAM), read-only memory (ROM), or compact-disc read-only-memory (CD-ROM), that contains current design rules for a plurality of cells, such that values for global variables are derived therefrom. In one embodiment, file 600 is a Microsoft Excel spreadsheet file, maintained by integration engineers that include the current design rules for a given process or device.

Extract mechanism 602 uses cleansheet file 600 to update global variables within global file 604. Mechanism 602 is desirably a computer program executed by a processor of a computer from a corresponding computer-readable medium. Thus, mechanism 602 reads file 600 and updates file 604 with the most current set of design rule values, as found in file 600. Global file 604 is desirably a file stored on a computer-readable medium, and includes a plurality of global variables (e.g., predefined design rule names), equating these variables to corresponding specific values.

Local file 606 is also desirably a file stored on a computer-readable medium. Local file 606 relates a plurality of local variables to the global variables of global file 604. That is, the plurality of local variables correspond to cell parameters, and are defined in terms of mathematical formula having global variables. In one embodiment of the invention local file 606 has a master file version, which is stored desirably on a computer-readable medium, and acts as an initial version of its corresponding local file.

Update mechanism 608 relates local file 606 to global file 604 to update the parameters of cell 610. Mechanism 608 is desirably a computer program executed by a processor of a computer from a corresponding computer-readable medium. Thus, for a given parameter within cell 610, mechanism 608 evaluates a definition of a corresponding local variable within local file 606, by substituting referenced global variables within the definition with values for the global variables as found in global file 604. That is, the update mechanism reads values for the global variables to which the local variables of the corresponding local file correspond. Note that while one update mechanism is shown, depending on the embodiment of the invention, there may be more than one such mechanism—one update mechanism for handling local files that are inherit files in the design of a cell, and another for handling local files that are instances files in the use of a cell.

In one embodiment of the invention, mechanism 608 is a computer program written in the SKILL computer language for use in conjunction with Design Framework II (DF2) software available from Cadence Design Systems, Inc. That is, the program causes each cell to refresh itself by opening a corresponding local file, reconnecting the local file to the global file, updating the parameter values as has been described, and refreshing each instance of that cell with the updated parameter values.

Finally, filegen mechanism 612 provides for the display of values of the local variables of a local file, and permits a user to change one or more of the values. Mechanism 612 is desirably a computer program executed by a processor of a computer from a corresponding computer-readable medium. Thus, mechanism 612 can either display the relation defined for a given local variable corresponding to a cell parameter (e.g., A2=A+5), and/or display the current evaluation of the given local variable corresponding to a cell parameter (e.g., A2=7, where A is set to two in the global file), and/or permit the user to change either the defined relation or the current evaluation (in the latter instance, by overriding the evaluation).

The computerized system as shown in and described in conjunction with FIG. 5 is particularly applicable to the cells of the hierarchical semiconductor test structure design approach described in the co-pending, co-filed, and co-assigned application entitled "Hierarchical Semiconductor Test Structure Design," as that design approach is utilized in conjunction with DF2. Note, however, that the invention is not so limited to utilization with the approach described in the above-identified application, nor is the invention limited to utilization in conjunction with DF2.

However, in the particular embodiment of the invention where the design of the semiconductor test structure is in accordance with the hierarchical manner described in the above-identified application, and is utilized in conjunction with DF2, desirably whenever a cell is placed as an instance, a form is presented that, instead of listing all the variables associated with that cell, requests a file name of the local file corresponding to that cell. Path information is assumed, so that only file names are input. The default file name appearing in the input field for all the cells is named master.

Thus, when a cell is placed, it looks for the file in the input field in a subdirectory having the same name as the cell. If the input file name is not found in this subdirectory, the input file name is changed to the default name (master), and that file is looked for in the subdirectory. If the master file is not found, such a file is created. In addition, if the subdirectory is not found, the subdirectory is created as well.

The system of FIG. 5 provides for advantages not found in the prior art. Updating of cell parameters—that is, population of parameters of cells—is automated by relating local files corresponding to these cells with a global file, which is derived from a cleansheet file. Thus, cell population is performed quickly, and without manual keying in of the data. This renders the invention efficient and error resistant.

Figure 6:
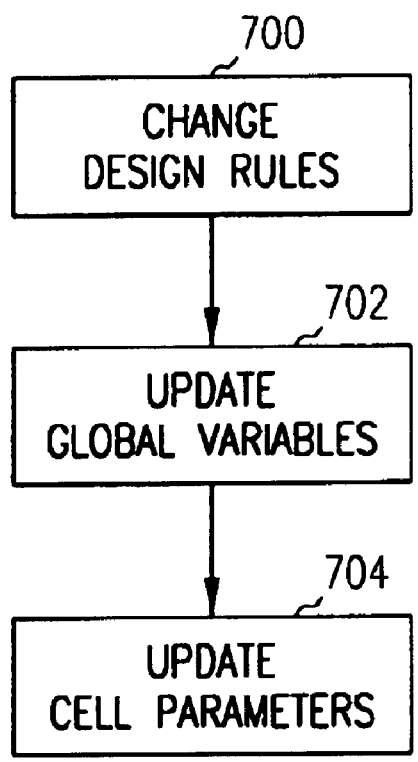

Referring finally to FIG. 6, a flowchart of a method according to one embodiment of the invention is shown. In step 700, an integration engineer makes a change to design rules as found in a cleansheet file. In step 702, the global variables of a global file are updated based on the design rules of the cleansheet file, by the execution of an extract mechanism. Finally, in step 704, cell parameters of one or more cells are updated by relating corresponding local variables of corresponding local files to corresponding global variables of the global file, and evaluating these relations. The performance of step 704 is accomplished by execution of an update mechanism.

A description of an exemplary embodiment of the invention has been described. Specifically, the manner by which global and local files are related to population cell parameters has been described. In addition, an exemplary system and method according to an embodiment of the invention have been described.

CONCLUSION

Parameter population of cells for a hierarchical semiconductor structure via file relation is disclosed. Although specific embodiments have been illustrated and described herein, it will be appreciated by those of ordinary skill in the art that any arrangement which is calculated to achieve the same purpose may be substituted for the specific embodiments shown. This application is intended to cover any adaptations or variations of the present invention. Therefore, it is manifestly intended that this invention be limited only by the following claims and equivalents thereof.

We claim:

1. A system for populating parameters of design cells defining a physical layout of a hierarchical semiconductor structure comprising:

a global file of global geometric variables relating to a physical layout of element blocks of the hierarchical semiconductor structure;

a plurality of local files, each local file containing parameters relating a plurality of local variables to the global geometric variables; and, a plurality of programmable design cells, each cell corresponding to a local file and having a set of parameters created by relating the corresponding local variables within a local file to appropriate global geometric variables from the global file such that changes of global geometric variables in the global file may cause changes in the design cells for the physical layout of the hierarchical semiconductor structure in accordance with parameters in the local files.

2. The system of claim 1, wherein at least one local file comprises an inherit file which inherits parameters from the global file.

3. The system of claim 1, wherein each local file comprises an instance file.

4. The system of claim 1, further comprising a plurality of master files, each master file acting as an initial version of a corresponding local file.

5. The system of claim 1, further comprising a cleansheet file containing current design rules for the plurality of cells such that values for the global variables of the global file are derived therefrom.

6. The system of claim 5, further comprising an extract mechanism to update values for the global variables of the global file from the current design rules of the cleansheet file.

7. The system of claim 1, further comprising a mechanism to display values for the local variables of a local file, and permit a user to change one or more of the values.

8. The system of claim 1, further comprising an update mechanism to update the set of parameters of each cell by reading values for the global variables to which the local variables of the corresponding local file correspond.

9. A computer-readable medium having a computer program stored thereon to cause a suitably equipped computer to update a set of geometric parameters of a design cell defining a physical layout of a hierarchical semiconductor structure by relating local geometric variables of a local file for the design cell to a global file of global geometric variables relating to layout of element blocks of a hierarchical semiconductor structure such that changes of a global geometric variable in the global file may cause changes in the design cell for the physical layout of the hierarchical semiconductor structure in accordance with parameters in the local files.

10. The computer-readable medium of claim 9, wherein each local file comprises an inherit file.

11. The computer-readable medium of claim 9, wherein each local file comprises an instance file.

12. The computer-readable medium of claim 9, further having a second computer program stored thereon to cause the suitably equipped computer to update values for the global variables of the global file from current design rules of a cleansheet file.

13. The computer-readable medium of claim 9, further having a second computer program stored thereon to display values for the local variables of the local file, and permit a user to change one or more of the values.

14. The computer-readable medium of claim 9, wherein the computer program is written in the SKILL computer language that is utilized in conjunction with Design Framework II software available from Cadence Design Systems, Inc.

15. A computer comprising:

a processor;

a computer-readable medium;

a global file of global geometric variables stored on the medium, at least some of the global geometric variables relating to physical layout of element blocks of hierarchical semiconductor structures;

a plurality of local files stored on the medium, each local file containing parameters relating a plurality of local variables to the global geometric variables; and, a computer program executed by the processor from the medium to automatically update a set of parameters for each of a plurality of programmable design cells for the physical layout of a hierarchical semiconductor structure, each cell having a corresponding local file, by reading, from the global file, values for the global geometric variables to which the local variables of the local file correspond.

16. The computer of claim 15, wherein each local file comprises an instance file.

17. The computer of claim 15, wherein each local file comprises an inherit file.

18. The computer of claim 15, further comprising a second computer program executed by the processor from the medium to display values for the local variables of a local file, and permit a user to change one or more of the values.

19. The computer of claim 15, further comprising a plurality of master files stored on the medium, each master file acting as an initial version of a corresponding local file.

20. The computer of claim 15, further comprising a cleansheet file stored on the medium and containing current design rules for the plurality of cells such that values for the global variables of the global file are derived therefrom.

21. The computer of claim 20, further comprising a second computer program executed by the processor from the medium to update values for the global variables of the global file from the current design rules of the cleansheet file.

22. A computerized method comprising:

changing within a cleansheet file at least one of a plurality of design rules for defining the physical layout of a hierarchical semiconductor structure;

updating values for a plurality of global geometric variables of a global file based on the design rules of the cleansheet file; and, updating a set of parameters of a programmable design cell for the physical layout of the hierarchical semiconductor structure by relating corresponding local variables of a local file corresponding to the programmable design cell to corresponding global geometric variables of the global file.

23. The computerized method of claim 22, wherein each local file comprises an inherit file.

24. The computerized method of claim 22, wherein each local file comprises an instance file.

25. The computerized method of claim 22, wherein the computerized method is performed in conjunction with Design Framework II software available from Cadence Design Systems, Inc.

26. The computerized method of claim 22, wherein changing design rules for defining the physical layout of a hierarchical semiconductor structure of a memory device includes changing the design rules within a cleansheet file.

27. The computerized method of claim 22, wherein each local file comprises an inherit file.

28. The computerized method of claim 22, wherein each local file comprises an instance file.

29. A system for populating parameters of design cells defining a physical layout of a hierarchical semiconductor structure comprising:

a global file of global geometric variables relating to a physical layout of element blocks of the hierarchical semiconductor structure;

an extract mechanism to update values for the global geometric variables of the global file;

a plurality of local files, each local file containing parameters relating a plurality of local variables to the global geometric variables;

a plurality of programmable design cells, each design cell corresponding to a local file and having a set of parameters;

an update mechanism to update the set of parameters of each design cell by relating values for the global geometric variables from the global file to which local variables of the corresponding local file correspond such that changes of global geometric variables in the global file may cause changes in the design cells for the physical layout of the hierarchical semiconductor structure in accordance with parameters in the local files.

30. The system of claim 29, wherein at least one local file comprises an inherit file which inherits parameters from the global file.

31. The system of claim 29, wherein each local file comprises an instance file.

32. The system of claim 29, wherein the system includes a computer having a display.

33. A computer-readable medium having a computer program stored thereon to cause a suitably equipped computer to update a set of geometric parameters of a design cell defining a physical layout of a hierarchical semiconductor structure for a memory device by relating local geometric variables of a local file for the design cell to a global file of global geometric variables relating to layout of element blocks of hierarchical semiconductor structures for the memory device such that changes of a global geometric variable in the global file may cause changes in the cells for the physical layout of the hierarchical semiconductor structure of the memory device in accordance with parameters in the local files.

34. The computer-readable medium of claim 33, further having a second computer program stored thereon to cause the suitably equipped computer to update values for the global variables of the global file from current design rules of a cleansheet file.

35. The computer-readable medium of claim 33, further having a second computer program stored thereon to display values for the local variables of the local file, and permit a user to change one or more of the values.

36. A computerized method comprising:

changing one or more design rules for defining the physical layout of a hierarchical semiconductor structure of a memory device;

updating values for a plurality of global geometric variables of a global file based on the changed design rules; and updating a set of parameters of a programmable design cell for the physical layout of the hierarchical semiconductor structure of the memory device by relating corresponding local variables of a local file corresponding to the programmable design cell to corresponding global geometric variables of the global file.

* * * * *